United States Patent
Harada

(10) Patent No.: US 11,212,913 B2
(45) Date of Patent: Dec. 28, 2021

(54) MANUFACTURING METHOD OF PRINTED BOARD

(71) Applicant: MURATA MANUFACTURING CO., LTD., Kyoto (JP)

(72) Inventor: Toshikazu Harada, Kariya (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 499 days.

(21) Appl. No.: 15/758,781

(22) PCT Filed: Aug. 22, 2016

(86) PCT No.: PCT/JP2016/074415
§ 371 (c)(1),
(2) Date: Mar. 9, 2018

(87) PCT Pub. No.: WO2017/043299
PCT Pub. Date: Mar. 16, 2017

(65) Prior Publication Data
US 2019/0053369 A1 Feb. 14, 2019

(30) Foreign Application Priority Data
Sep. 10, 2015 (JP) .............................. JP2015-178512

(51) Int. Cl.
*H05K 3/00* (2006.01)
*H05K 3/46* (2006.01)
*H05K 1/02* (2006.01)

(52) U.S. Cl.
CPC ............. *H05K 1/028* (2013.01); *H05K 1/024* (2013.01); *H05K 1/0271* (2013.01);
(Continued)

(58) Field of Classification Search
CPC ...... H05K 1/0278; H05K 1/028; H05K 1/024; H05K 3/4629; H05K 2201/0191; H05K 2203/068
See application file for complete search history.

(56) References Cited

U.S. PATENT DOCUMENTS 5,028,473 A * 7/1991 Vitriol ................. H01L 21/4857
156/89.12
5,925,298 A * 7/1999 Walles .................. B29C 53/063
264/138
(Continued)

FOREIGN PATENT DOCUMENTS

CN 102573278 A 7/2012
CN 103460823 A 12/2013
(Continued)

*Primary Examiner* — Livius R. Cazan
*Assistant Examiner* — Jeffrey T Carley
(74) *Attorney, Agent, or Firm* — Harness, Dickey & Pierce, P.L.C.

(57) ABSTRACT

Resin films, all of which are formed of the same resin material, are laminated to form a laminate. Heat and pressure are applied to the laminate to integrate the resin films into one piece; then the pressure applied to the laminate is released and the laminate is cooled. In a predetermined region of the laminate which is to constitute a bent part, one or more of the resin films are arranged on each of one side and the other side in a lamination direction of the resin films with respect to one conductor pattern; and the total thickness of the one or more resin films arranged on the one side is larger than the total thickness of the one or more resin films arranged on the other side. Consequently, the predetermined region can be bent by utilizing the difference between contraction force generated in the one or more resin films arranged on the one side and contraction force generated in the one or more resin films arranged on the other side during the cooling after the application of heat and pressure.

14 Claims, 14 Drawing Sheets

(52) U.S. Cl.
CPC ......... *H05K 1/0278* (2013.01); *H05K 3/0044* (2013.01); *H05K 3/4617* (2013.01); *H05K 3/4652* (2013.01); *H05K 3/4691* (2013.01); *H05K 2201/0129* (2013.01); *H05K 2201/0141* (2013.01); *H05K 2201/0145* (2013.01); *H05K 2201/0154* (2013.01); *H05K 2201/0191* (2013.01); *H05K 2203/068* (2013.01)

(56) References Cited

U.S. PATENT DOCUMENTS

| | | | | |
|---|---|---|---|---|
| 7,812,258 | B2 * | 10/2010 | Price | G11B 5/4846 |
| | | | | 174/110 R |
| 9,326,376 | B2 * | 4/2016 | Ishikawa | H05K 1/028 |
| 9,769,920 | B2 * | 9/2017 | Ely | H05K 1/0281 |
| 10,517,170 | B2 * | 12/2019 | Oguri | H05K 1/028 |
| 2006/0158861 | A1 * | 7/2006 | Shouji | H01L 23/4985 |
| | | | | 361/750 |
| 2008/0093110 | A1 * | 4/2008 | Bagung | H05K 1/189 |
| | | | | 174/254 |
| 2009/0266578 | A1 * | 10/2009 | Price | G11B 5/4846 |
| | | | | 174/117 FF |
| 2012/0111624 | A1 | 5/2012 | Maeda | |
| 2014/0034365 | A1 | 2/2014 | Otsubo | |
| 2015/0373829 | A1 * | 12/2015 | Ishikawa | H05K 3/282 |
| | | | | 174/254 |

FOREIGN PATENT DOCUMENTS

| | | | | |
|---|---|---|---|---|
| JP | H09-023052 | A | 1/1997 | |
| JP | 2002/305382 | A | 10/2002 | |
| JP | 2009-302343 | * | 12/2009 | ............... H05K 3/46 |
| WO | WO-2012/124421 | A1 | 9/2012 | |
| WO | WO-2017032576 | A1 * | 3/2017 | ........... H05K 1/0278 |

\* cited by examiner

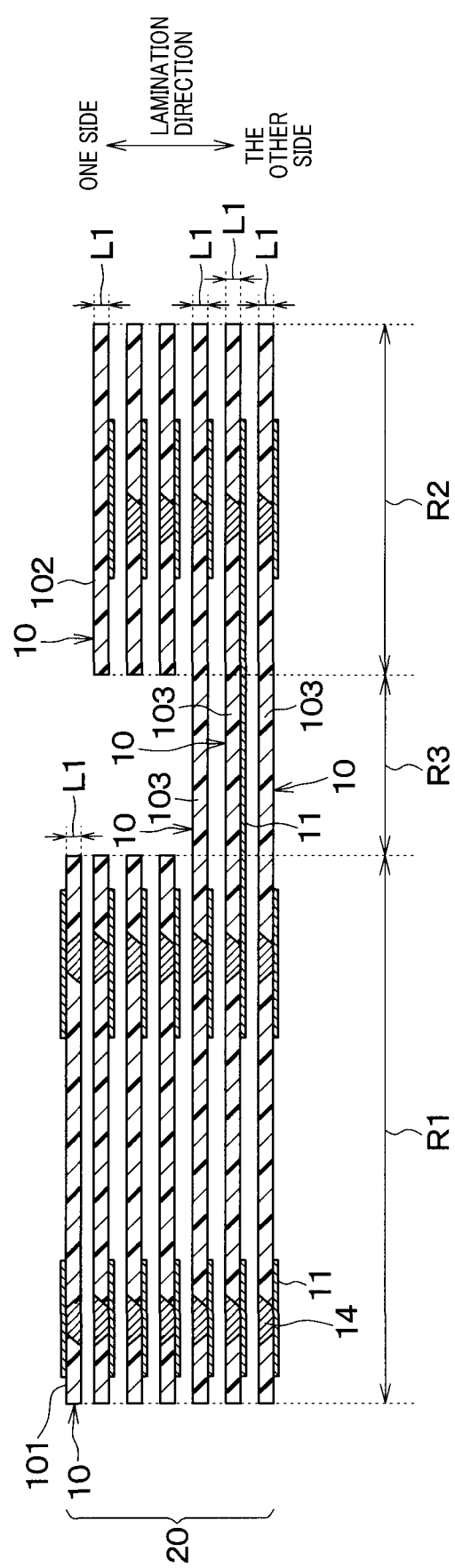

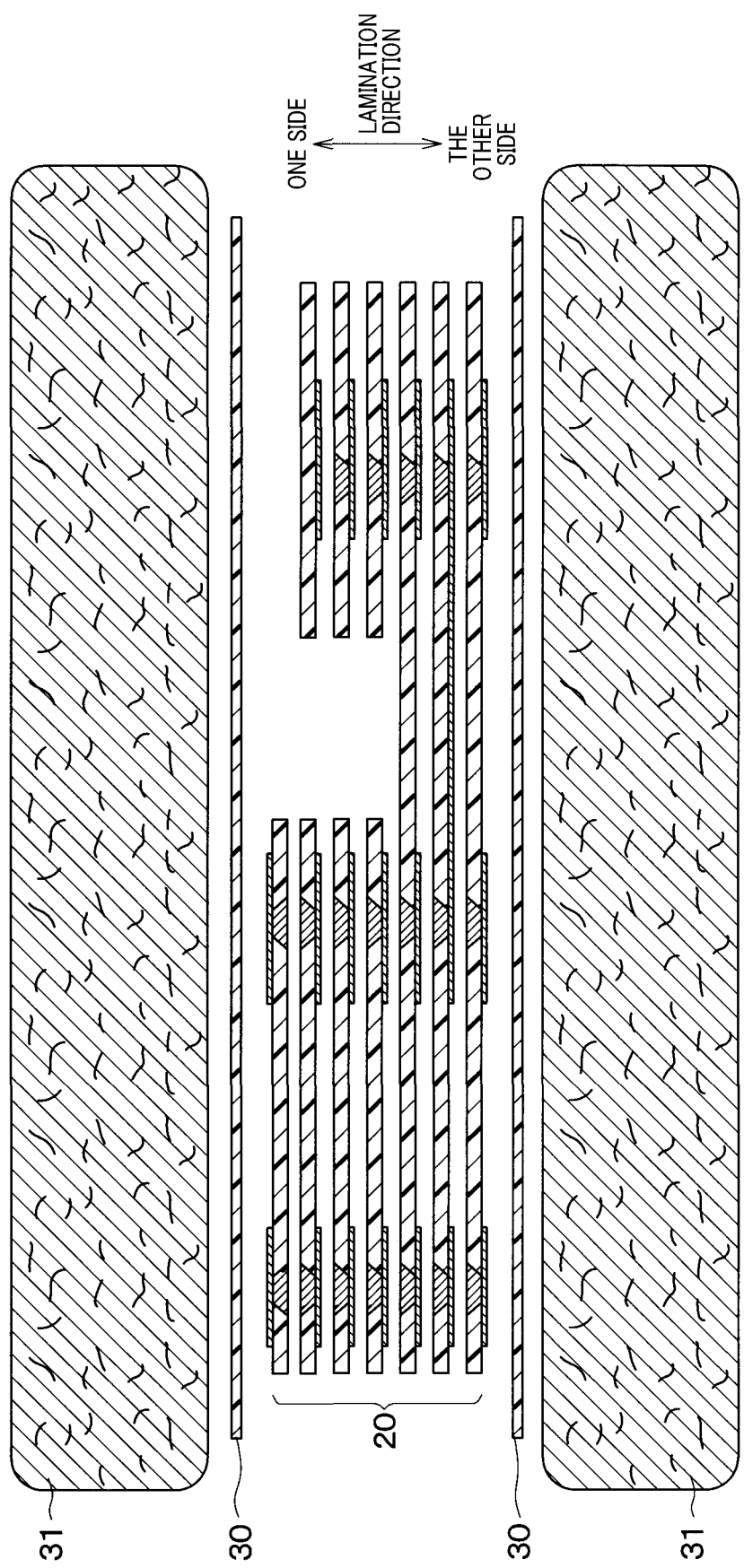

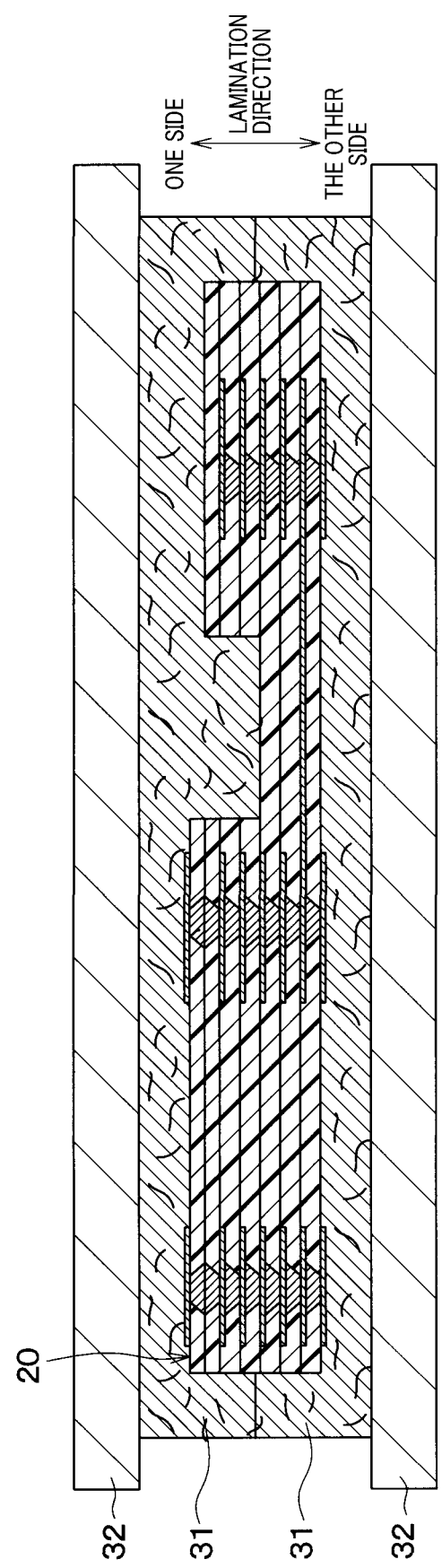

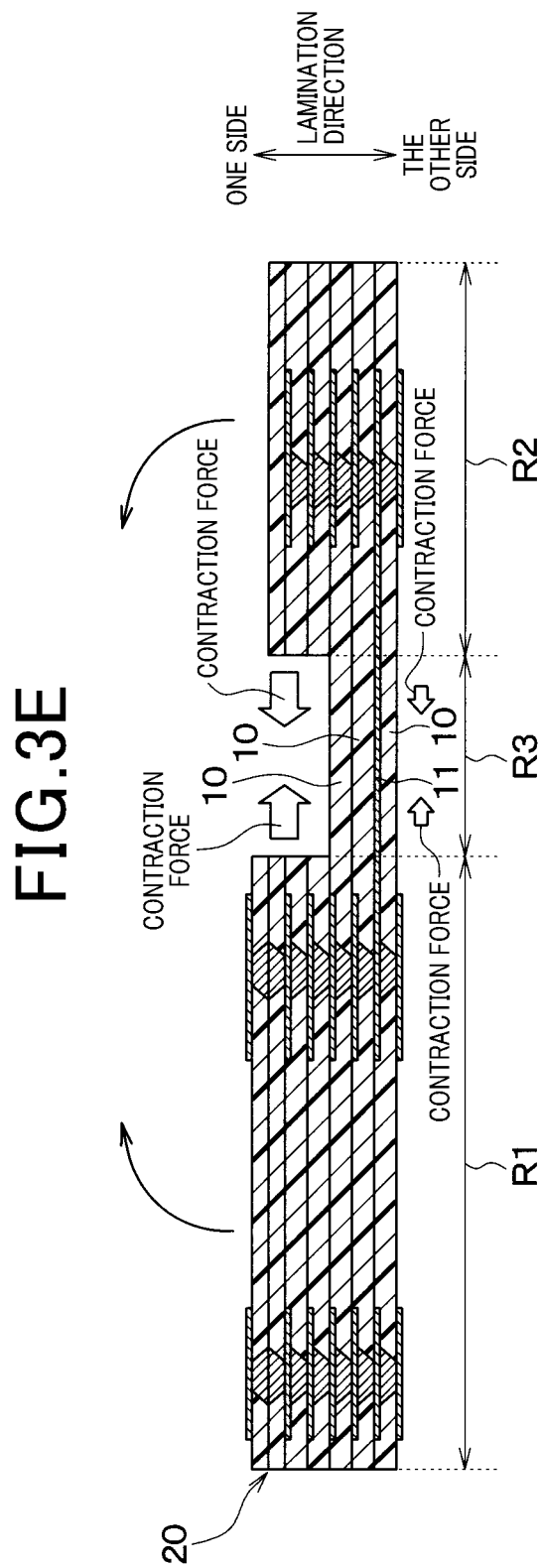

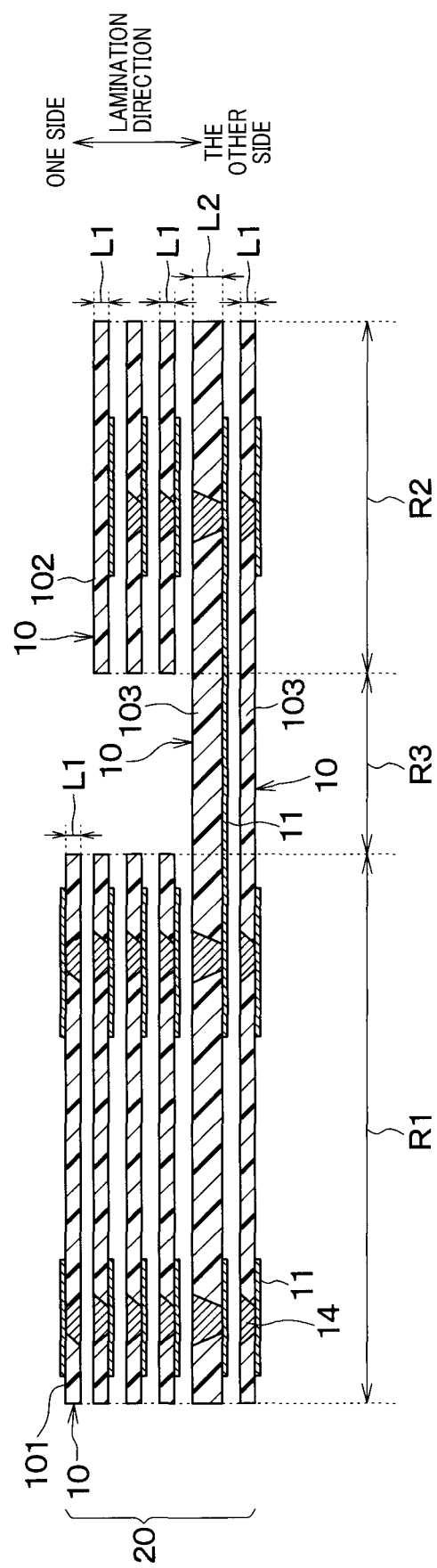

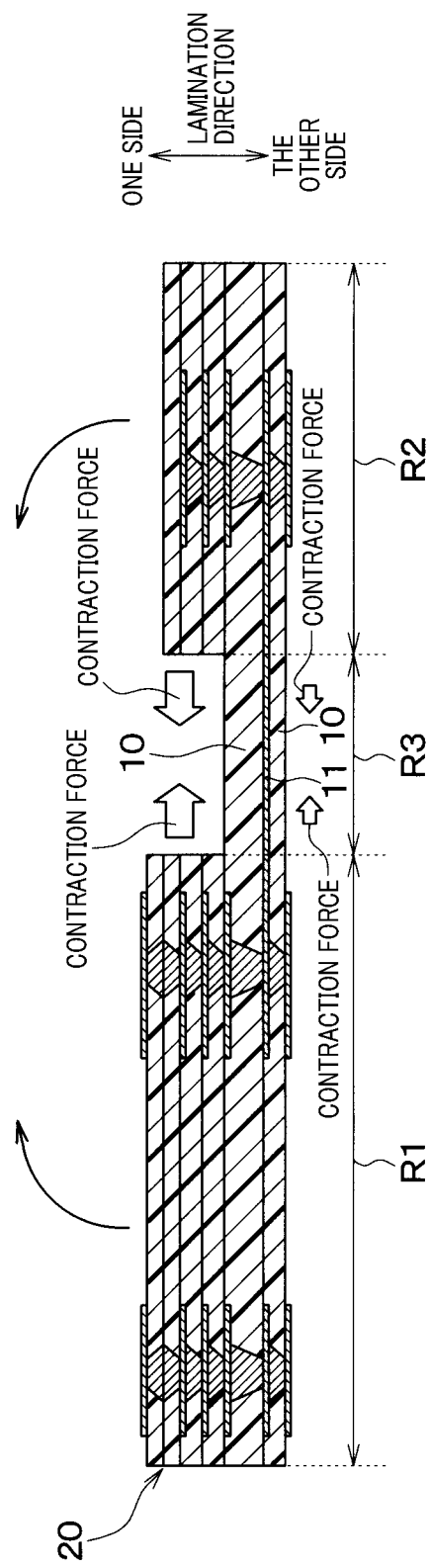

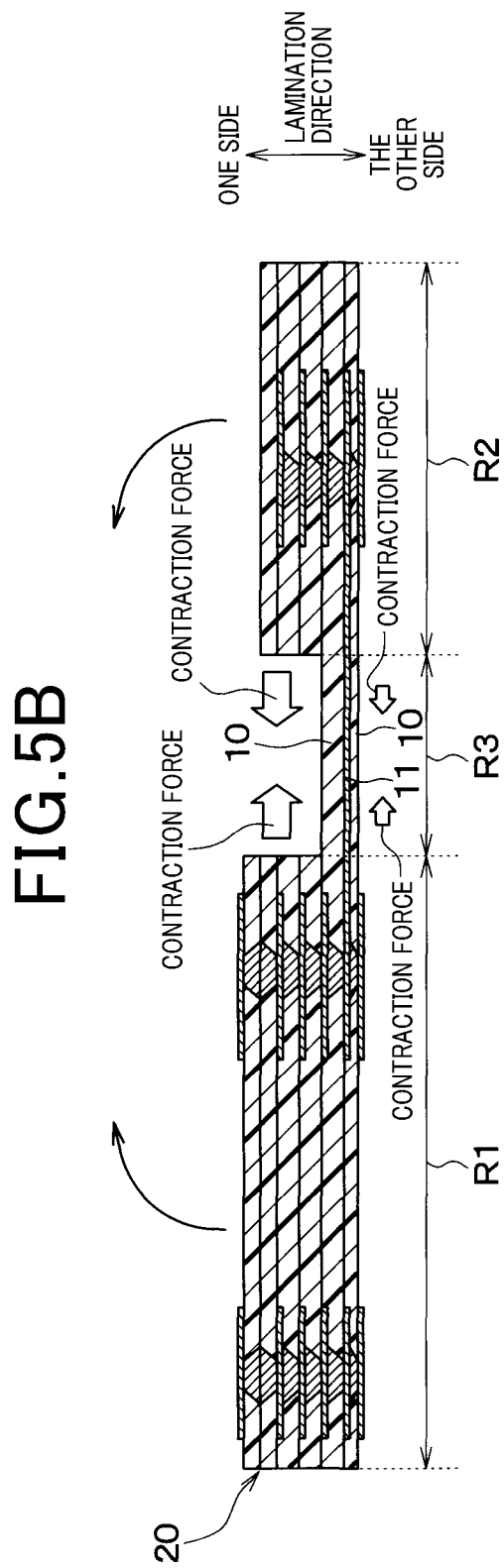

MANUFACTURING METHOD OF PRINTED BOARD

CROSS REFERENCE TO RELATED APPLICATIONS

This application is a U.S. National Phase Application under 35 U.S.C. 371 of International Application No. PCT/JP2016/074415 filed on Aug. 22, 2016 and published in Japanese as WO 2017/043299 A1 on Mar. 16, 2017. This application is based on and claims the benefit of priority from Japanese Patent Application No. 2015-178512 filed on Sep. 10, 2015. The entire disclosures of all of the above applications are incorporated herein by reference.

TECHNICAL FIELD

The present invention relates to manufacturing methods of printed boards.

BACKGROUND ART

In Patent Document 1, there is disclosed a manufacturing method of a printed board which has a bent part that is permanently bent. According to the manufacturing method, the bent part is formed as follows. A plurality of insulating layers, which are formed of different resin materials, are laminated to form a flat plate-shaped printed board. Then, a part of the printed board which is to constitute the bent part is heated. During cooling after the heating, the insulating layers shrink. At this time, since the thermal shrinkage percentages of the different materials are different, the printed board becomes bent.

PRIOR ART LITERATURE

Patent Literature

[PATENT DOCUMENT 1] Japanese Patent Application Publication No. JPH0923052A

SUMMARY OF THE INVENTION

Problems to be Solved by the Invention

The printed board manufactured by the above-described prior art employs insulating layers formed of different resin materials. Therefore, as described below, there occurs a problem that the reliability is lowered.

That is, the different resin materials have different coefficients of thermal expansion. Therefore, when the printed board is subjected to cooling/heating cycles, thermal stress is induced at junctions where the insulating layers formed of the different resin materials are joined to each other. Due to the thermal stress, it is easy for delamination to occur at the junctions.

In view of the above, the present invention aims to provide a manufacturing method of a printed board which has a bent part and whose reliability is high.

Means for Solving the Problems

According to the present disclosure, a manufacturing method of a printed board (1) having a bent part (4) includes:
a preparing step for preparing a plurality of film-like insulating base members (10), the insulating base members being formed of, at least, a resin material and having conductor patterns (11) formed on their surfaces;
a laminating step for laminating the insulating base members to form a laminate (20); and
a heat-and-pressure applying step for applying heat and pressure to the laminate to integrate the insulating base members into one piece and then releasing the pressure applied to the laminate and cooling the laminate,
wherein
all of the insulating base members prepared in the preparing step are formed of the same resin material,
in the laminating step, the laminate is formed so that: in a predetermined region (R3) of the laminate which is to constitute the bent part, one or more of the insulating base members are arranged on each of one side and the other side in a lamination direction of the insulating base members with respect to one or more of the conductor patterns; and a total thickness of the one or more insulating base members arranged on the one side is larger than a total thickness of the one or more insulating base members arranged on the other side,
in the heat-and-pressure applying step, the predetermined region is bent by utilizing a phenomenon that during the cooling, contraction force generated in the one or more insulating base members on the one side is larger than contraction force generated in the one or more insulating base members on the other side.

Though the insulating base members are formed of the same resin material, during the cooling after the heating, the contraction force generated in the one or more insulating base members having the larger total thickness is larger than the contraction force generated in the one or more insulating base members having the smaller total thickness. Therefore, it is possible to bend the predetermined region by utilizing the difference between the contraction forces. Hence, with the manufacturing method, it is possible to manufacture the printed board that has the bent part.

In the manufacturing method of the printed board, insulating base members formed of the same resin material are employed. As a result, it is possible to suppress those parts where the insulating base members are jointed to each other from being delaminated by thermal stress. Hence, it is possible to improve the reliability of the resultant printed board in comparison with the prior art.

In addition, the reference sign in parentheses of each means described in this section indicates the correspondence with concrete means described in the following embodiments.

BRIEF DESCRIPTION OF THE DRAWINGS

FIG. 3B is a cross-sectional view illustrating part of the manufacturing process of the printed board according to the first embodiment.

FIG. 3C is a cross-sectional view illustrating part of the manufacturing process of the printed board according to the first embodiment.

FIG. 3D is a cross-sectional view illustrating part of the manufacturing process of the printed board according to the first embodiment.

FIG. 3E is a cross-sectional view illustrating part of the manufacturing process of the printed board according to the first embodiment.

FIG. 4A is a cross-sectional view illustrating part of a manufacturing process of a printed board according to a second embodiment.

FIG. 4B is a cross-sectional view illustrating part of the manufacturing process of the printed board according to the second embodiment.

FIG. 5B is a cross-sectional view illustrating part of the manufacturing process of the printed board according to the third embodiment.

EMBODIMENTS FOR CARRYING OUT THE INVENTION

Hereinafter, embodiments of the present invention will be described with reference to the drawings. In addition, in the following embodiments, explanation will be made assigning the same reference signs to identical or equivalent parts.

First Embodiment

Figure 1:
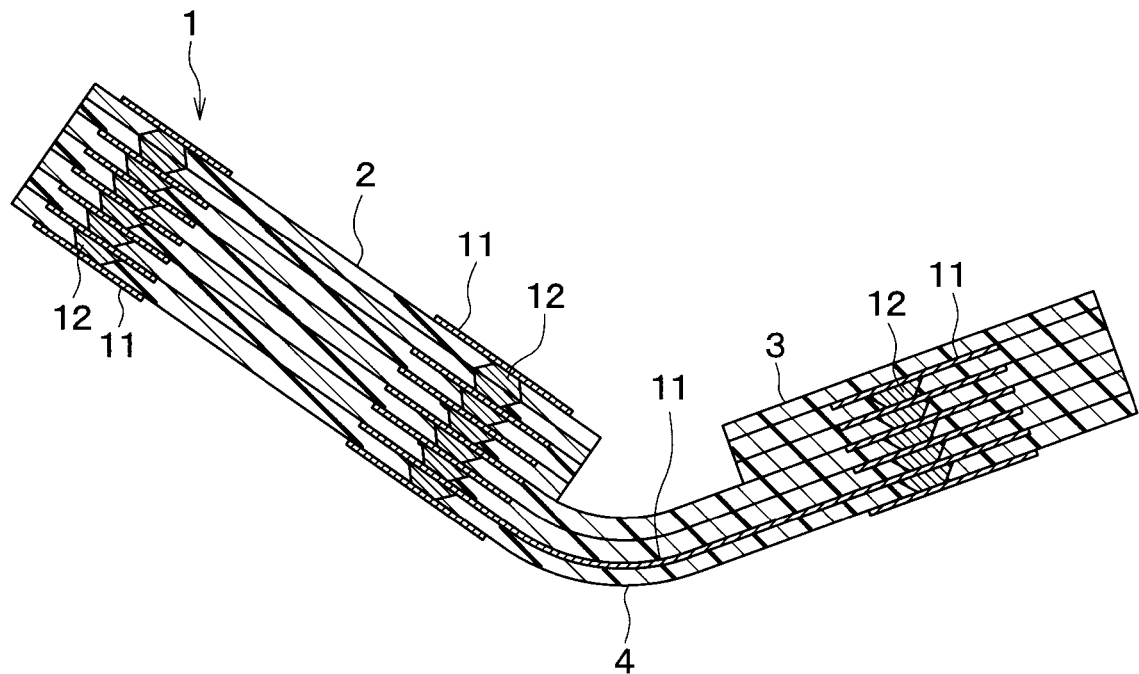
FIG. 1 is a cross-sectional view of a printed board according to a first embodiment.

As shown in FIG. 1, a printed board 1 according to the present embodiment has a first board part 2, a second board part 3 and a bent part 4.

The bent part 4 is located between the first board part 2 and the second board part 3. The bent part 4 connects the first board part 2 and the second board part 3. The bent part 4 has flexibility. The bent part 4 is permanently bent. The bent part 4 has conductor patterns 11 as wiring that electrically connects wiring of the first board part 2 and wiring of the second board part 3.

The first board part 2 is thicker than the bent part 4 and harder than the bent part 4 as well. The second board part 3 is thicker than the bent part 4 and harder than the bent part 4 as well. Each of the first board part 2 and the second board part 3 has, as the wiring, a plurality of conductor patterns 11 and a plurality of vias 12. The plurality of conductor patterns 11 and the plurality of vias 12 are alternately connected.

Figure 2:
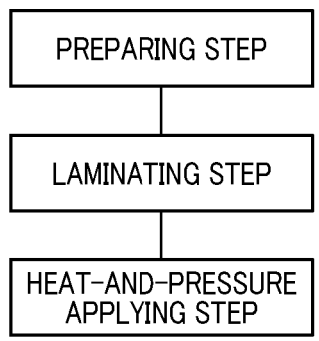
FIG. 2 is a flowchart illustrating a manufacturing process of the printed board according to the first embodiment.

Next, a manufacturing method of the printed board 1 according to the present embodiment will be described. As shown in FIG. 2, the manufacturing method mainly includes a preparing step, a laminating step and a heat-and-pressure applying step which are sequentially performed.

Figure 3A:
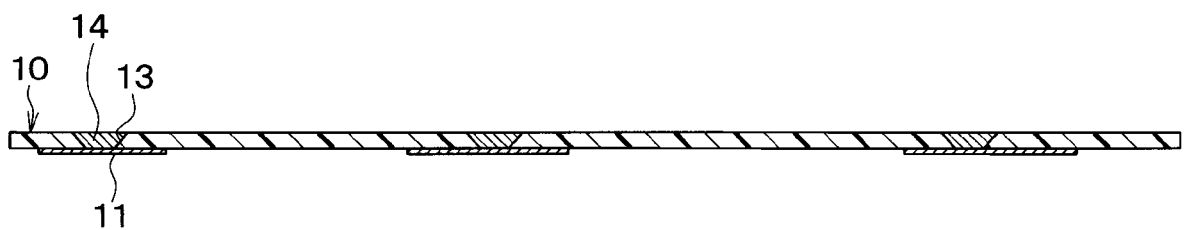
FIG. 3A is a cross-sectional view illustrating part of the manufacturing process of the printed board according to the first embodiment.

In the preparing step, a plurality of resin films 10 are prepared which have the conductor patterns 11 formed on their surfaces as shown in FIG. 3A. The resin films 10 are film-like insulating base members that are formed of a resin material. The resin material is a thermoplastic resin. The thermoplastic resin may be, for example, a liquid crystal polymer (abbreviation: LCP), a polyetherether ketone (abbreviation: PEEK), a thermoplastic polyimide (abbreviation: PI) or a polyether imide (abbreviation: PEI).

In the preparing step, a pattern formation is performed, by etching, on a conductor foil provided on one surface of each resin film 10. Consequently, the conductor patterns 11 are formed on one surface of each resin film 10. As the conductor foil, for example, a copper foil, a silver foil, a tin foil or the like may be used. Then, via holes 13 are formed in each resin film 10 by laser processing or drilling. Thereafter, into the via holes 13, a via-forming material 14 is embedded to form the vias 12. As the via-forming material 14, a metal powder, such as a copper powder, a tin powder, a silver powder or the like, in the form of a paste may be used. In the heat-and-pressure applying step to be described later, the metal powder is heated and thereby sintered to form the vias 12.

In the present embodiment, all of the prepared resin films 10 are formed of the same thermoplastic resin. Moreover, all of the prepared resin films 10 have the same thickness.

In the laminating step, as shown in FIG. 3B, the plurality of resin films 10 are laminated to form a laminate 20. At this time, the number of the resin films 10 laminated in each of a first region R1 and a second region R2 is set to be greater than the number of the resin films 10 laminated in a third region R3. The first region R1 is a region in the laminate 20 for forming the first board part 2. The second region R2 is a region in the laminate 20 for forming the second board part 3. The third region R3 is a region in the laminate 20 for forming the bent part 4. Accordingly, in the laminate 20, the third region R3 is a predetermined region which is to constitute the bent part 4.

Specifically, a plurality of resin films 103 are laminated which have a first region R1, a second region R2 and a third region R3. A plurality of resin films 101 are laminated on only the first region R1 of the resin films 103. A plurality of resin films 102 are laminated on only the second region R2 of the resin films 103.

As described above, all of the resin films 10 forming the laminate 20 have the same thickness. Accordingly, of the resin films 10, the resin films 101 arranged in only the first region R1, the resin films 102 arranged in only the second region R2, and the resin films 103 having the first region R1, the second region R2 and the third region R3 have the same predetermined thickness L1. The predetermined thickness L1 is, for example, 25 µm. Moreover, all of the conductor patterns 11 have the same thickness of, for example, 9 μm. In addition, the thickness of those conductor patterns 11 which are located at ends in the lamination direction may be set to be larger than the thickness of the other conductor patterns 11, for example, to 12 μm.

Moreover, in the third region R3 of the laminate 20, there are laminated three resin films 103 and one conductor pattern 11. The conductor pattern 11 is arranged from the first region R1, via the third region R3, to the second region R2.

The third region R3 of the laminate 20 has a structure in which: two resin films 103 are arranged on one side in the lamination direction of the resin films 10 (i.e., the upper side in the vertical direction in FIG. 3B) with respect to the one conductor pattern 11; and one resin film 103 is arranged on the other side in the lamination direction (i.e., the lower side in the vertical direction in FIG. 3B). In this way, in the third region R3 of the laminate 20, the number of the resin films 10 arranged on the one side in the lamination direction with respect to the conductor pattern 11 is set to be greater than the number of the resin films 10 arranged on the other side in the lamination direction. Consequently, the total thickness of the resin films 10 arranged on the one side in the lamination direction with respect to the conductor pattern 11 is set to be larger than the total thickness of the resin films 10 arranged on the other side in the lamination direction.

In the heat-and-pressure applying step, heat and pressure are applied to the laminate 20, thereby integrating the plurality of resin films 10 into one piece. Specifically, as shown in FIG. 3C, a release sheet 30 and a buffer assist member 31 are arranged on each side of the laminate 20 in the lamination direction. Then, as shown in FIG. 3D, pressure is applied, from both sides of the laminate 20 in the lamination direction via the release sheets 30 and the buffer assist members 31, to the laminate 20 by press plates 32 while heating the laminate 20. In addition, the release sheets 30 are omitted from FIG. 3D.

The release sheets 30 are formed of a resin material such as a polyimide (abbreviation: PI), polytetrafluoroethylene (abbreviation: PTFE) or the like. The thickness of the release sheets 30 is in the range of 12 to 75 μm. As the buffer assist members 31, members obtained by processing stainless steel fibers into a plate shape, members obtained by processing rock wool and aramid fibers into a plate shape or members formed of expanded porous PTFE may be used. The thickness of the buffer assist members 31 is in the range of 3 to 10 mm. The press plates 32 are formed of a metal such as stainless steel or the like. The thickness of the press plates 32 is in the range of 3 to 5 mm.

At this time, the heating temperature is a temperature at which the thermoplastic resin forming the resin film 10 can be softened to flow. The heating temperature is in the range of, for example, 200 to 350° C. In this step, the thermoplastic resin flows to fill gaps 22 in the laminate 20. Moreover, the resin films 10 are bonded to one another, thereby being integrated into one piece. At the same time, the via-forming material 14 is sintered by the heating to form the vias 12.

In the heat-and-pressure applying step, after the application of heat and pressure, the press plates 32, the buffer assist members 31 and the like are removed. Consequently, pressure applied to the laminate 20 is released and the laminate 20 is cooled. During the cooling, contraction force is generated in the resin films 10 forming the laminate 20. At this time, the larger the total thickness of the resin films 10, the larger the contraction force generated during the cooling. Accordingly, as shown in FIG. 3E, in the third region R3, the contraction force generated in the two resin films 10 located on the upper side of the conductor pattern 11 is larger than the contraction force generated in the one resin film 10 located on the lower side of the conductor pattern 11. Therefore, the third region R3 is bent with the side where the total thickness of the resin films 10 is larger, i.e., the side where there are arranged the two resin films 10 being the inner side of the bending.

In the above manner, the printed board 1 as shown in FIG. 1 is manufactured.

As described above, the printed board 1 according to the present embodiment has the bent part 4 that is permanently bent. Here, a printed board that has a flexible part with flexibility is often inserted in a housing or the like in a state of being bent. However, since the insertion is performed with the flexible part being bent by application of force, there is a problem that it is difficult to insert the printed board into a narrow place.

In contrast, the printed board 1 according to the present embodiment has a permanent bend and thus can be easily inserted into a narrow place. Moreover, even if the printed board 1 is inserted in a state of being bent, the compressive stress acting on a portion on the inner side of the bending is lower and thus it is more difficult for the printed board 1 to be broken in comparison with the case of having no permanent bend.

Moreover, in the manufacturing method of the printed board 1 according to the present embodiment, all of the resin films 10 constituting the laminate 20 are formed of the same resin material. As a result, it is possible to suppress those parts where the resin films 10 are jointed to each other from being delaminated by thermal stress. Hence, it is possible to improve the reliability of the resultant printed board 1 in comparison with the prior art of employing insulating layers formed of different resin materials.

Moreover, the manufacturing method of the printed board 1 according to the present embodiment is a method which utilizes the contraction force of the resin films 10 generated during the cooling in the heat-and-pressure applying step. Accordingly, it is possible to form the bent part 4 at the time of formation of the printed board 1, i.e., at the time of completion of the heat-and-pressure applying step. Therefore, it is unnecessary to perform an additional bending step after the heat-and-pressure applying step. Accordingly, with the manufacturing method of the printed board 1 according to the present embodiment, it is possible to simplify the manufacturing process of the printed board 1 in comparison with the case of performing a bending step after formation of the printed board 1.

Second Embodiment

In a manufacturing method of a printed board 1 according to the present embodiment, the thicknesses of the employed resin films 10 are modified in comparison with the manufacturing method of the printed board 1 according to the first embodiment.

In the present embodiment, in the preparing step, as shown in FIG. 4A, as resin films 10 constituting a laminate 20, resin films having a first thickness L1 and a resin film having a second thickness L2 larger than the first thickness L1 are prepared. The first thickness L1 is, for example, 25 μm. The second thickness L2 is, for example, 50 μm.

In the laminating step, the laminate 20 is formed which has a configuration as shown in FIG. 4A. In the laminate 20, the resin films 101, which are arranged in only the first region R1, each have the first thickness L1. The resin films 102, which are arranged in only the second region R2, each have the first thickness L1. The single resin film 103, which is arranged on one side (i.e., the upper side in FIG. 4A) of the conductor pattern 11 in the lamination direction in the third region 103, has the second thickness L2. The single resin film 103, which is arranged on the other side (i.e., the lower side in FIG. 4A) of the conductor pattern 11 in the lamination direction in the third region 103, has the first thickness L1.

Consequently, in the third region R3 of the laminate 20, the thickness of the resin film 10 arranged on the one side in the lamination direction with respect to the conductor pattern 11 is set to be larger than the thickness of the resin film 10 arranged on the other side in the lamination direction with respect to the conductor pattern 11.

Figure 4C:
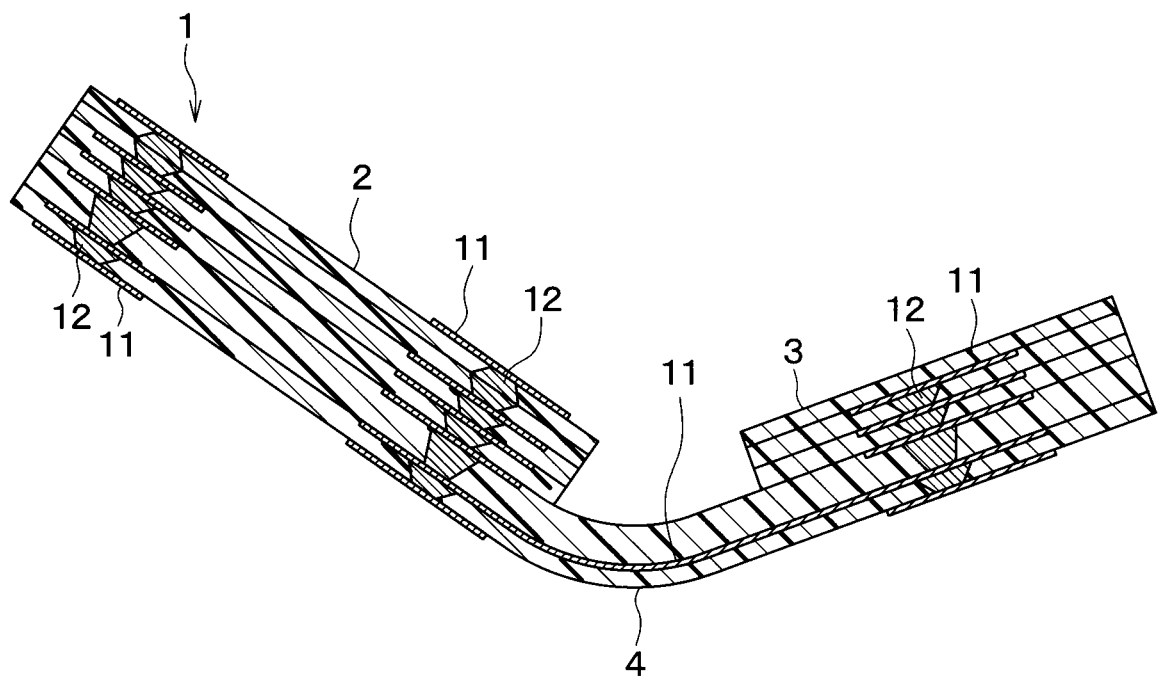
FIG. 4C is a cross-sectional view illustrating part of the manufacturing process of the printed board according to the second embodiment.

Accordingly, in the present embodiment, as shown in FIG. 4B, during the cooling in the heat-and-pressure applying step, in the third region R3, the contraction force generated in the resin film 10 having the larger thickness is larger than the contraction force generated in the resin film 10 having the smaller thickness. Therefore, as shown in FIG. 4C, the third region R3 is bent with the side where the thickness of the resin film 10 is larger being the inner side of the bending.

Third Embodiment

In a manufacturing method of a printed board 1 according to the present embodiment, the thicknesses of the employed resin films 10 are modified in comparison with the manufacturing methods of the printed boards 1 according to the first and second embodiments.

Figure 5A:
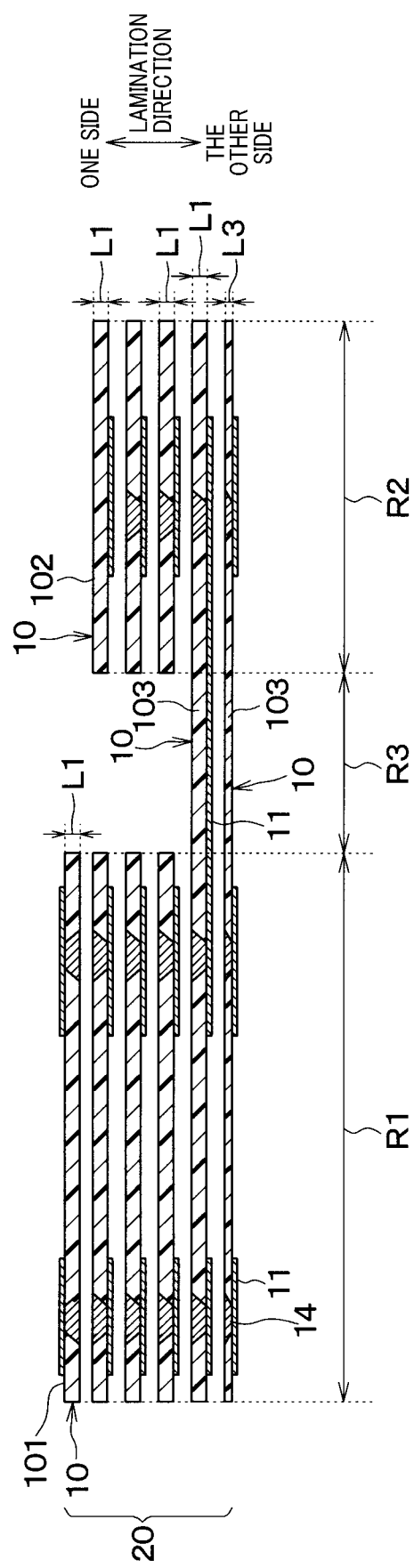
FIG. 5A is a cross-sectional view illustrating part of a manufacturing process of a printed board according to a third embodiment.

In the present embodiment, in the preparing step, as shown in FIG. 5A, as resin films 10 constituting a laminate 20, resin films having a first thickness L1 and a resin film having a second thickness L3 smaller than the first thickness L1 are prepared. The first thickness L1 is, for example, 25 µm. The second thickness L3 is, for example, 12.5 µm.

In the laminating step, the laminate 20 is formed which has a configuration as shown in FIG. 5A. In the laminate 20, the resin films 101, which are arranged in only the first region R1, each have the first thickness L1. The resin films 102, which are arranged in only the second region R2, each have the first thickness L1. The single resin film 103, which is arranged on one side (i.e., the upper side in FIG. 5A) of the conductor pattern 11 in the lamination direction in the third region 103, has the first thickness L1. The single resin film 103, which is arranged on the other side (i.e., the lower side in FIG. 5A) of the conductor pattern 11 in the lamination direction in the third region 103, has the second thickness L3.

Consequently, in the third region R3 of the laminate 20, the thickness of the resin film 10 arranged on the one side in the lamination direction with respect to the conductor pattern 11 is set to be larger than the thickness of the resin film 10 arranged on the other side in the lamination direction with respect to the conductor pattern 11.

Figure 5C:
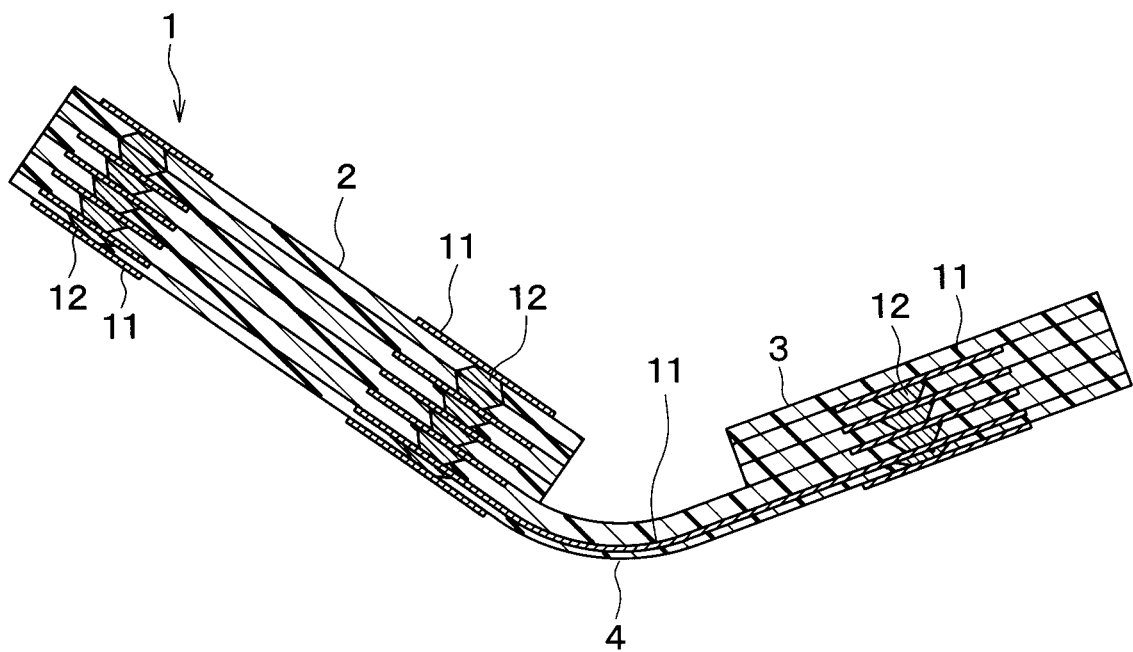
FIG. 5C is a cross-sectional view illustrating part of the manufacturing process of the printed board according to the third embodiment.

Accordingly, in the present embodiment, as shown in FIG. 5B, during the cooling in the heat-and-pressure applying step, in the third region R3, the contraction force generated in the resin film 10 having the larger thickness is larger than the contraction force generated in the resin film 10 having the smaller thickness. Therefore, as shown in FIG. 5C, the third region R3 is bent with the side where the thickness of the resin film 10 is larger being the inner side of the bending.

Fourth Embodiment

A manufacturing method of a printed board according to the present embodiment is a method of manufacturing a printed board the whole of which constitutes a bent part. The manufactured printed board is a flexible board the whole of which has flexibility. The manufacturing method of the printed board according to the present embodiment differs from the manufacturing method of the printed board according to the first embodiment in that no first and second board parts 2 and 3 are formed; the remainder is basically the same.

Figure 6A:
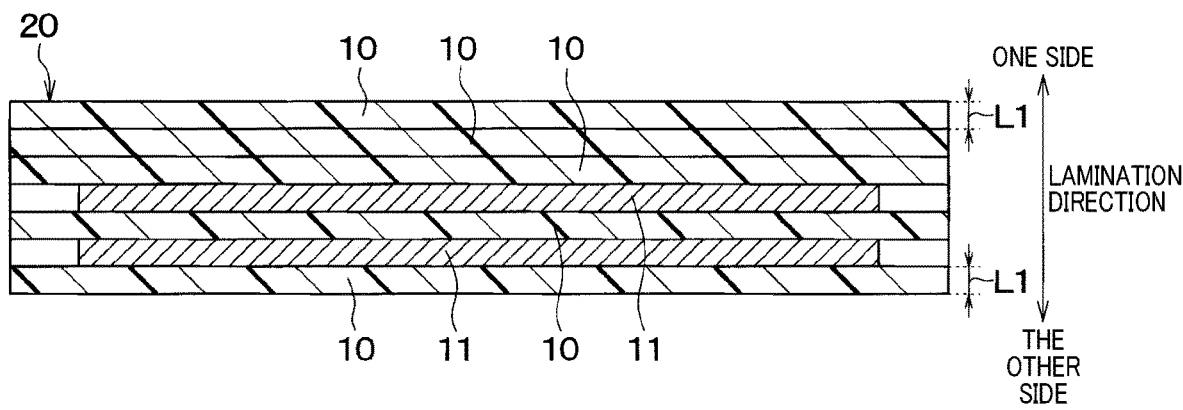
FIG. 6A is a cross-sectional view illustrating part of a manufacturing process of a printed board according to a fourth embodiment.

In the present embodiment, in the preparing step, as shown in FIG. 6A, resin films 10 are prepared which have the same thickness L1. The thickness L1 is, for example, 25 µm.

In the laminating step, a laminate 20 is formed which has a configuration as shown in FIG. 6A. In the laminate 20, one resin film 10 is arranged between two conductor patterns 11. Three resin films 10 are arranged on one side in the lamination direction of the resin films 10 (i.e., the upper side in the vertical direction in FIG. 6A) with respect to the two conductor patterns 11. One resin film 10 is arranged on the other side in the lamination direction (i.e., the lower side in the vertical direction in FIG. 6A) with respect to the two conductor patterns 11.

In this way, the number of the resin films 10 arranged on the one side in the lamination direction with respect to the two conductor patterns 11 is set to be larger than the number of the resin films 10 arranged on the other side in the lamination direction. Consequently, the total thickness of the resin films 10 arranged on the one side in the lamination direction with respect to the two conductor patterns 11 is set to be larger than the thickness of the resin film 10 arranged on the other side in the lamination direction.

Figure 6B:
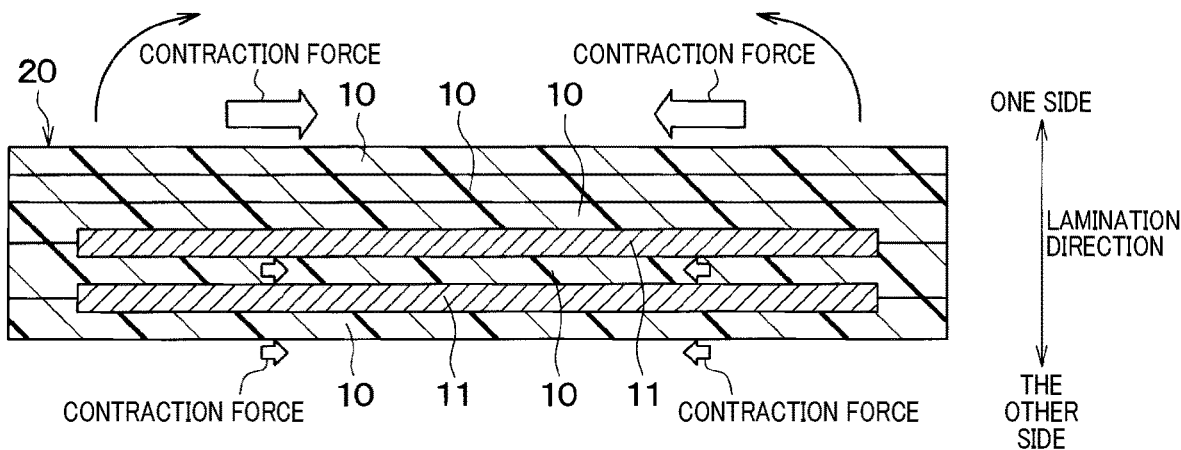
FIG. 6B is a cross-sectional view illustrating part of the manufacturing process of the printed board according to the fourth embodiment.
Figure 6C:
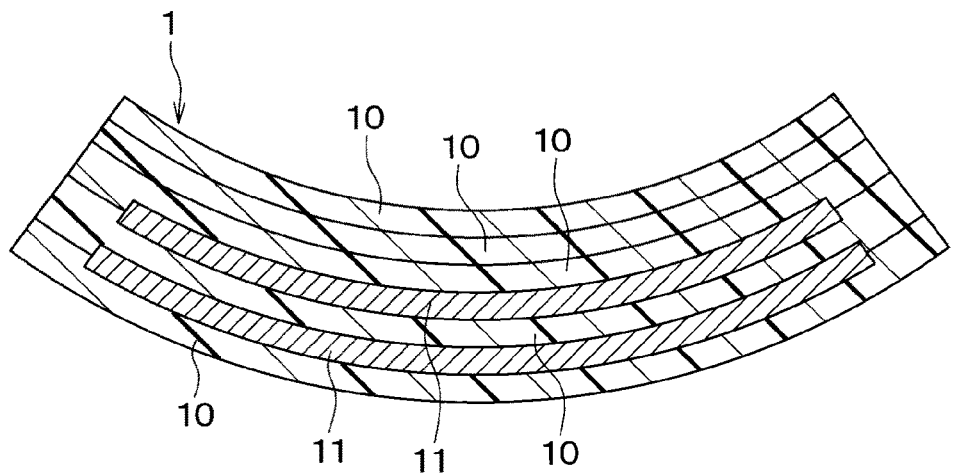
FIG. 6C is a cross-sectional view illustrating part of the manufacturing process of the printed board according to the fourth embodiment.

Accordingly, in the present embodiment, as shown in FIG. 6B, during the cooling in the heat-and-pressure applying step, the contraction force generated in the resin films 10 having the larger total thickness is larger than the contraction force generated in the resin film 10 having the smaller total thickness. Therefore, as shown in FIG. 6C, the printed board 1 is bent with the side where the total thickness of the resin films 10 is larger being the inner side of the bending.

Fifth Embodiment

In a manufacturing method of a printed board 1 according to the present embodiment, the thicknesses of the employed resin films 10 are modified in comparison with the manufacturing method of the printed board 1 according to the fourth embodiment.

Figure 7A:
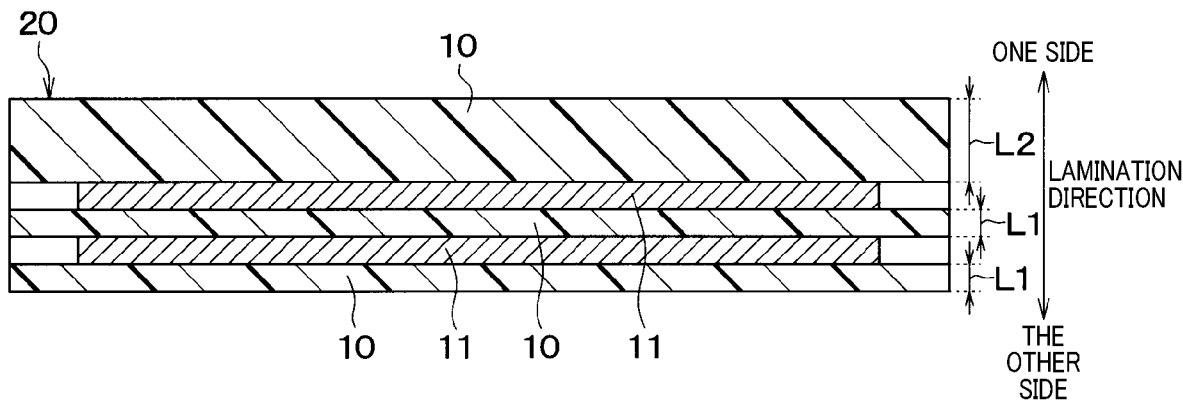
FIG. 7A is a cross-sectional view illustrating part of a manufacturing process of a printed board according to a fifth embodiment.

In the present embodiment, in the preparing step, as shown in FIG. 7A, as resin films 10 constituting a laminate 20, resin films having a first thickness L1 and a resin film having a second thickness L2 larger than the first thickness L1 are prepared. The first thickness L1 is, for example, 25 µm. The second thickness L2 is, for example, 75 µm.

In the laminating step, the laminate 20 is formed which has a configuration as shown in FIG. 7A. In the laminate 20, the single resin film 10, which is arranged between two conductor patterns 11, has the first thickness L1. The single resin film 10, which is arranged on one side in the lamination direction of the resin films 10 (i.e., the upper side in the vertical direction in FIG. 7A) with respect to the two conductor patterns 11, has the second thickness L2. The single resin film 10, which is arranged on the other side in the lamination direction (i.e., the lower side in the vertical direction in FIG. 7A) with respect to the two conductor patterns 11, has the first thickness L1.

Consequently, in the laminate 20, the thickness of the resin film 10 arranged on the one side in the lamination direction with respect to the two conductor patterns 11 is set to be larger than the thickness of the resin film 10 arranged on the other side in the lamination direction.

Figure 7B:
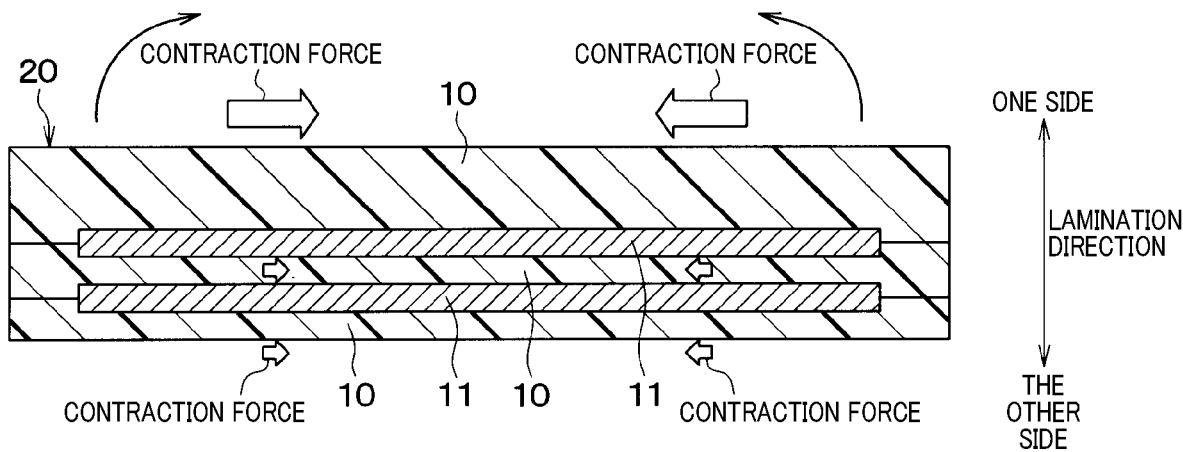
FIG. 7B is a cross-sectional view illustrating part of the manufacturing process of the printed board according to the fifth embodiment.
Figure 7C:
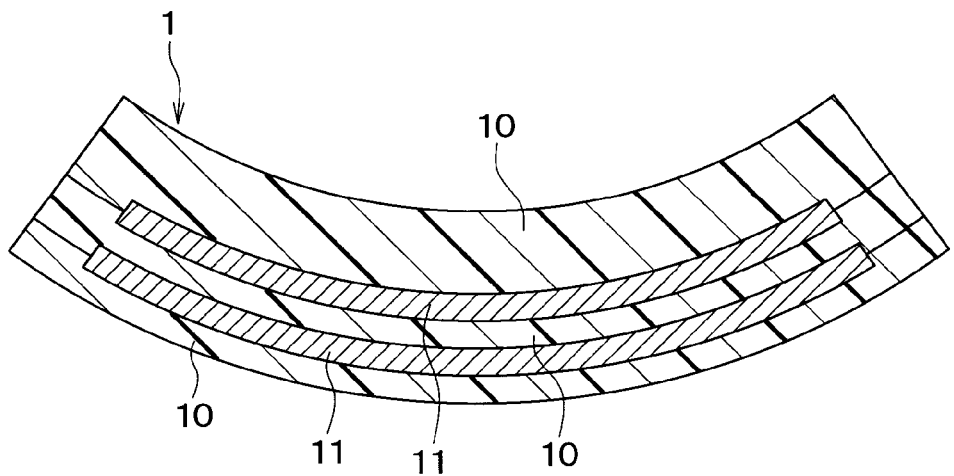
FIG. 7C is a cross-sectional view illustrating part of the manufacturing process of the printed board according to the fifth embodiment.

Accordingly, in the present embodiment, as shown in FIG. 7B, during the cooling in the heat-and-pressure applying step, the contraction force generated in the resin film 10 having the larger thickness is larger than the contraction force generated in the resin film 10 having the smaller thickness. Therefore, as shown in FIG. 7C, the printed board 1 is bent with the side where the thickness of the resin film 10 is larger being the inner side of the bending.

Sixth Embodiment

In a manufacturing method of a printed board 1 according to the present embodiment, the thicknesses of the employed resin films 10 are modified in comparison with the manufacturing method of the printed board 1 according to the fourth embodiment.

Figure 8A:
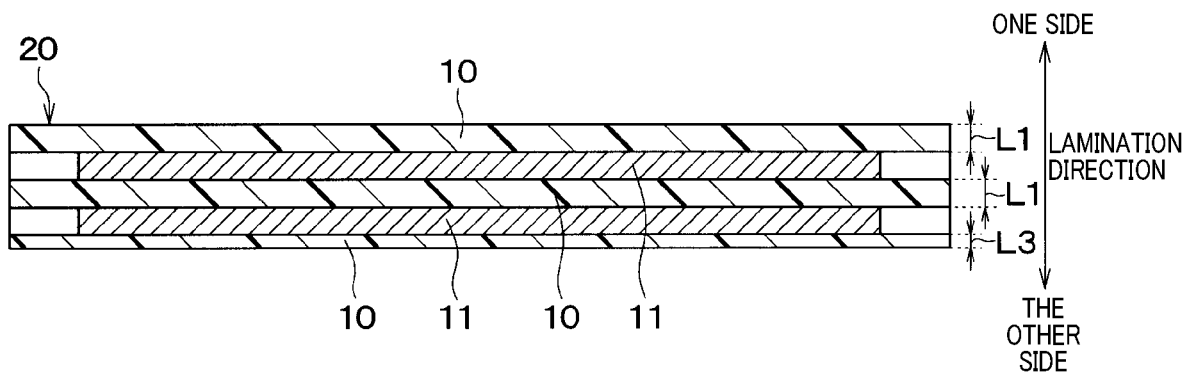
FIG. 8A is a cross-sectional view illustrating part of a manufacturing process of a printed board according to a sixth embodiment.

In the present embodiment, in the preparing step, as shown in FIG. 8A, as resin films 10 constituting a laminate 20, resin films having a first thickness L1 and a resin film having a second thickness L3 smaller than the first thickness L1 are prepared. The first thickness L1 is, for example, 25 μm. The second thickness L3 is, for example, 12.5 μm.

In the laminating step, the laminate 20 is formed which has a configuration as shown in FIG. 8A. In the laminate 20, the single resin film 10, which is arranged between two conductor patterns 11, has the first thickness L1. The single resin film 10, which is arranged on one side in the lamination direction of the resin films 10 (i.e., the upper side in the vertical direction in FIG. 8A) with respect to the two conductor patterns 11, has the first thickness L1. The single resin film 10, which is arranged on the other side in the lamination direction (i.e., the lower side in the vertical direction in FIG. 8A) with respect to the two conductor patterns 11, has the second thickness L3.

Consequently, in the laminate 20, the thickness of the resin film 10 arranged on the upper side of the two conductor patterns 11 is set to be larger than the thickness of the resin film 10 arranged on the lower side of the two conductor patterns 11.

Figure 8B:
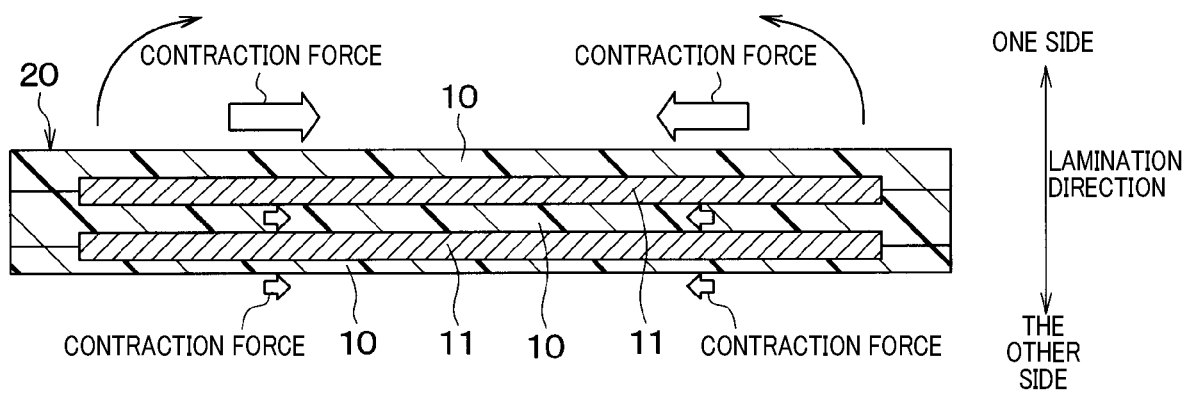
FIG. 8B is a cross-sectional view illustrating part of the manufacturing process of the printed board according to the sixth embodiment.
Figure 8C:
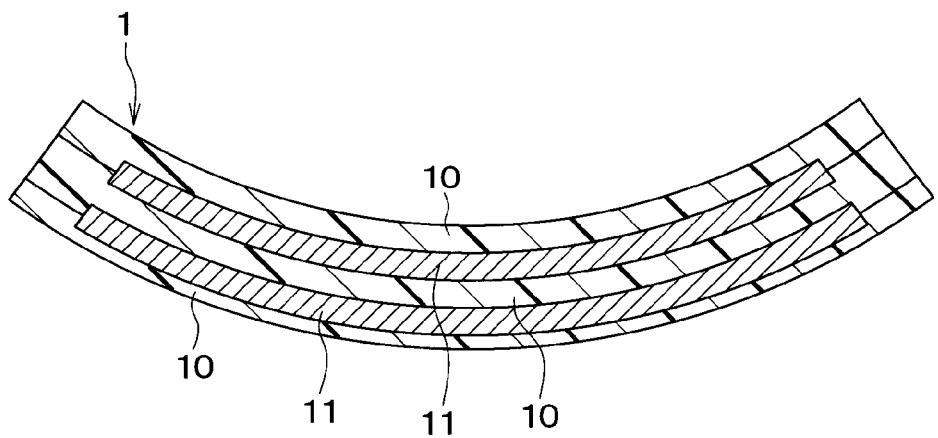
FIG. 8C is a cross-sectional view illustrating part of the manufacturing process of the printed board according to the sixth embodiment.

Accordingly, in the present embodiment, as shown in FIG. 8B, during the cooling in the heat-and-pressure applying step, the contraction force generated in the resin film 10 having the larger thickness is larger than the contraction force generated in the resin film 10 having the smaller thickness. Therefore, as shown in FIG. 8C, the printed board 1 is bent with the side where the thickness of the resin film 10 is larger being the inner side of the bending.

OTHER EMBODIMENTS

The present invention is not limited to the above-described embodiments. As described below, modifications may be suitably made without departing from the spirit of the present invention.

(1) In the first embodiment, in the third region R3 of the laminate 20, two resin films 10 are arranged on one side in the lamination direction of the resin films 10 with respect to the one conductor pattern 11; and one resin film 10 is arranged on the other side in the lamination direction. However, the number of resin films 10 on each side of the one conductor pattern 11 may be modified. That is, in the third region R3 of the laminate 20, on each of the one side and the other side in the lamination direction of the resin films 10 with respect to the one conductor pattern 11, there may be arranged one or more resin films 10; and the number of the one or more resin films 10 arranged on the one side in the lamination direction with respect to the conductor pattern 11 may be larger than the number of the one or more resin films 10 arranged on the other side in the lamination direction. Similarly, in the fourth embodiment, the number of resin films 10 on each side of the two conductor patterns 11 may be modified.

(2) In the first embodiment, all of the resin films 10 laminated in the third region R3 of the laminate 20 have the same thickness. However, the resin films 10 may have different thicknesses. For example, in the third region R3 of the laminate 20, where two resin films 10 are arranged on one side in the lamination direction of the resin films 10 with respect to the one conductor pattern 11 and one resin film 10 is arranged on the other side in the lamination direction, all the thicknesses of the three resin films 10 may be set to be different from each other. Similarly, in the fourth embodiment, all the thicknesses of the resin films 10 on both sides of the two conductor patterns 11 may be set to be different from each other.

(3) In the second embodiment, in the third region R3 of the laminate 20, one resin film 10 having the second thickness L2 is arranged on one side of the conductor pattern 11 in the lamination direction; and one resin film 10 having the first thickness L1 is arranged on the other side of the conductor pattern 11 in the lamination direction. However, the number of resin films 10 on each side of the conductor pattern 11 may be modified to be greater than or equal to two. For example, in the third region R3 of the laminate 20, two or more resin films 10 having the second thickness L2 may be arranged on the one side of the conductor pattern 11 in the lamination direction; and resin films 10 having the first thickness L1, the number of which is equal to the number of the resin films 10 having the second thickness L2, may be arranged on the other side of the conductor pattern 11 in the lamination direction. Similarly, in the fifth embodiment, the number of resin films 10 on each side of the two conductor patterns 11 may be modified to be greater than or equal to two.

(4) In the third embodiment, in the third region R3 of the laminate 20, one resin film 10 having the first thickness L1 is arranged on one side of the conductor pattern 11 in the lamination direction; and one resin film 10 having the second thickness L3 is arranged on the other side of the conductor pattern 11 in the lamination direction. However, the number of resin films 10 on each side of the conductor pattern 11 may be modified to be greater than or equal to two. For example, in the third region R3 of the laminate 20, two or more resin films 10 having the first thickness L1 may be arranged on the one side of the conductor pattern 11 in the lamination direction; and resin films 10 having the second thickness L3, the number of which is equal to the number of the resin films 10 having the first thickness L1, may be arranged on the other side of the conductor pattern 11 in the lamination direction. Similarly, in the sixth embodiment, the number of resin films 10 on each side of the two conductor patterns 11 may be modified to be greater than or equal to two.

(5) In the first to the third embodiments, one conductor pattern 11 is arranged in the third region R3 of the laminate 20; however, two or more conductor patterns 11 may be arranged in the third region R3 of the laminate 20 as in the fourth to the sixth embodiments. In this case, in the third region R3 of the laminate 20, on each of one side and the other side in the lamination direction of the resin films 10 with respect to the two or more conductor patterns 11, there may be arranged one or more resin films 10; and the total thickness of the one or more resin films 10 arranged on the one side in the lamination direction may be larger than the total thickness of the one or more resin films 10 arranged on the other side in the lamination direction.

(6) In the above-described embodiments, as the resin material for forming the resin films 10, a thermoplastic resin is used; however, a thermosetting resin may be used instead. The thermosetting resin may be an epoxy resin. Moreover, the resin films 10 are not limited to those formed of only a resin material; as the resin films 10, those formed of a resin material and another material, such as a reinforcement material, may be used. For example, as the resin films 10, those formed of an epoxy resin with glass cloth added may be used.

(7) The above-described embodiments are not irrelevant to each other; they may be suitably combined with each other unless the combination is obviously impossible. Moreover, in the above-described embodiments, elements constituting the embodiments are not necessarily essential unless they are particularly specified as being essential or can be considered to be obviously essential in principle.

DESCRIPTION OF REFERENCE SIGNS

1 printed board
2 first board part
3 second board part
4 bent part
10 resin films
11 conductor patterns
20 laminate
R1 first region for forming first board part
R2 second region for forming second board part
R3 third region for forming bent part

What is claimed is:

1. A manufacturing method of a printed board that has a permanently-bent part, the manufacturing method comprising:
   a preparing step for preparing a plurality of insulating base members, each being a film, the insulating base members being formed of, at least, a resin material, and the preparing step including forming conductor patterns on surfaces of the insulating base members;
   a laminating step for laminating the insulating base members to form a laminate; and
   a heat-and-pressure applying step for applying heat and pressure to the laminate to integrate the insulating base members into one piece and then releasing the pressure applied to the laminate and cooling the laminate,
   wherein
   all of the insulating base members prepared in the preparing step are formed of the same resin material,
   in the laminating step, the laminate is formed so that: in a predetermined region of the laminate which is to constitute the permanently-bent part, one or more of the insulating base members are arranged on each of one side and the other side of all of the conductor patterns in the predetermined region in a lamination direction of the insulating base members, and a total thickness of the one or more insulating base members arranged on the one side of all of the conductor patterns in the predetermined region is larger than a total thickness of the one or more insulating base members arranged on the other side of all of the conductor patterns in the predetermined region,
   in the heat-and-pressure applying step, the predetermined region is bent, with the one side of all of the conductor patterns in the predetermined region being an inner side of the bending, during the cooling by a contraction force generated in the one or more insulating base members on the one side of all of the conductor patterns in the predetermined region that is larger than a contraction force generated in the one or more insulating base members on the other side of all of the conductor patterns in the predetermined region,
   the predetermined region constitutes the entirety of the permanently-bent part of the printed board and the total thickness of the one or more insulating base members arranged on the one side of all of the conductor patterns throughout the entirety of the predetermined region is larger than the total thickness of the one or more insulating base members arranged on the other side of all of the conductor patterns throughout the entirety of the predetermined region, and
   each of the one or more insulating base members has a constant thickness.

2. The manufacturing method of the printed board as set forth in claim 1, wherein in the laminating step, the laminate is formed so that the number of the one or more insulating base members arranged on the one side of all of the conductor patterns in the predetermined region is greater than the number of the one or more insulating base members arranged on the other side of all of the conductor patterns in the predetermined region.

3. The manufacturing method of the printed board as set forth in claim 2, wherein each of the insulating base members prepared in the preparing step have the same individual thickness.

4. The manufacturing method of the printed board as set forth in claim 1, wherein in the laminating step, the laminate is formed so that the number of the insulating base members laminated in another region, which is at a different position from the predetermined region, is greater than the number of the insulating base members laminated in the predetermined region.

5. The manufacturing method of the printed board as set forth in claim 4, wherein the insulating base members prepared in the preparing step each have a predetermined thickness, and
   in the laminating step, the laminate is formed so that:
   the number of the one or more insulating base members arranged on the one side of all of the conductor patterns in the predetermined region is greater than the number of the one or more insulating base members arranged on the other side of all of the conductor patterns in the predetermined region.

6. The manufacturing method of the printed board as set forth in claim 4, wherein
   in the laminating step, the laminate is formed so that:
   the insulating base members arranged in the another region each have a first thickness;
   the one or more insulating base members arranged on the one side of all of the conductor patterns in the predetermined region each have a second thickness;
   the one or more insulating base members arranged on the other side of all of the conductor patterns in the predetermined region each have the first thickness; and
   the second thickness is greater than the first thickness.

7. The manufacturing method of the printed board as set forth in claim 4, wherein
   in the laminating step, the laminate is formed so that:
   the insulating base members arranged in the another region each have a first thickness;

the one or more insulating base members arranged on the one side of all of the conductor patterns in the predetermined region each have the first thickness;

the one or more insulating base members arranged on the other side of all of the conductor patterns in the predetermined region each have a second thickness;

the second thickness is less than the first thickness.

8. A manufacturing method of a printed board that has a permanently-bent part, the manufacturing method comprising:

a preparing step for preparing a plurality of insulating base members, each being a film, the insulating base members being formed of, at least, a resin material, and the preparing step including forming conductor patterns on surfaces of the insulating base members;

a laminating step for laminating the insulating base members to form a laminate; and a heat-and-pressure applying step for applying heat and pressure to the laminate to integrate the insulating base members into one piece and then releasing the pressure applied to the laminate and cooling the laminate, wherein all of the insulating base members prepared in the preparing step are formed of the same resin material, in the laminating step, the laminate is formed so that: in a predetermined region of the laminate which is to constitute the permanently-bent part, there is arranged only one of the conductor patterns and one or more of the insulating base members are arranged on each of one side and the other side of the only one of the conductor patterns in the predetermined region in a lamination direction of the insulating base members, and a total thickness of the one or more insulating base members arranged on the one side of the only one of the conductor patterns in the predetermined region is larger than a total thickness of the one or more insulating base members arranged on the other side of the only one of the conductor patterns in the predetermined region, in the heat-and-pressure applying step, the predetermined region is bent, with the one side of the only one of the conductor patterns in the predetermined region being an inner side of the bending, during the cooling by a contraction force generated in the one or more insulating base members on the one side of the only one of the conductor patterns in the predetermined region that is larger than a contraction force generated in the one or more insulating base members on the other side of the only one of the conductor patterns in the predetermined region, the predetermined region constitutes the entirety of the permanently-bent part of the printed board and the total thickness of the one or more insulating base members arranged on the one side of the only one of the conductor patterns throughout the entirety of the predetermined region is larger than the total thickness of the one or more insulating base members arranged on the other side of the only one of the conductor patterns throughout the entirety of the predetermined region, and each of the one or more insulating base members has a constant thickness.

9. The manufacturing method of the printed board as set forth in claim 8, wherein in the laminating step, the laminate is formed so that the number of the one or more insulating base members arranged on the one side of the only one of the conductor patterns in the predetermined region is greater than the number of the one or more insulating base members arranged on the other side of the only one of the conductor patterns in the predetermined region.

10. The manufacturing method of the printed board as set forth in claim 9, wherein each of the insulating base members prepared in the preparing step have the same individual thickness.

11. The manufacturing method of the printed board as set forth in claim 8, wherein in the laminating step, the laminate is formed so that the number of the insulating base members laminated in another region, which is at a different position from the predetermined region, is greater than the number of the insulating base members laminated in the predetermined region.

12. The manufacturing method of the printed board as set claim 11, wherein the insulating base members prepared in the preparing step each have a predetermined thickness, and in the laminating step, the laminate is formed so that:

the number of the one or more insulating base members arranged on the one side of the only one of the conductor patterns in the predetermined region is greater than the number of the one or more insulating base members arranged on the other side of the only one of the conductor patterns in the predetermined region.

13. The manufacturing method of the printed board as set claim 11, wherein in the laminating step, the laminate is formed so that:

the insulating base members arranged in the another region each have a first thickness;

the one or more insulating base members arranged on the one side of the only one of the conductor patterns in the predetermined region each have a second thickness;

the one or more insulating base members arranged on the other side of the only one of the conductor patterns in the predetermined region each have the first thickness; and the second thickness is greater than the first thickness.

14. The manufacturing method of the printed board as set forth in claim 11, wherein in the laminating step, the laminate is formed so that:

the insulating base members arranged in the another region each have a first thickness;

the one or more insulating base members arranged on the one side of the only one of the conductor patterns in the predetermined region each have the first thickness;

the one or more insulating base members arranged on the other side of the only one of the conductor patterns in the predetermined region each have a second thickness;

the second thickness is less than the first thickness.

* * * * *